United States Patent
Ishii et al.

(10) Patent No.: US 8,152,583 B2
(45) Date of Patent: Apr. 10, 2012

(54) MANUFACTURING METHOD OF ORGANIC EL DISPLAY DEVICE

(75) Inventors: Yoshinori Ishii, Chiba (JP); Satoru Kase, Mobara (JP); Eiji Matsuzaki, Yokohama (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 12/537,597

(22) Filed: Aug. 7, 2009

(65) Prior Publication Data

US 2010/0035505 A1 Feb. 11, 2010

(30) Foreign Application Priority Data

Aug. 8, 2008 (JP) ................................. 2008-205206

(51) Int. Cl.
*H01J 9/24* (2006.01)

(52) U.S. Cl. .......................................... 445/24; 313/512

(58) Field of Classification Search .................. 445/24, 445/25, 23; 313/512
See application file for complete search history.

(56) References Cited

U.S. PATENT DOCUMENTS

| 2003/0206332 | A1* | 11/2003 | Yamazaki et al. | 359/312 |
| 2006/0135029 | A1* | 6/2006 | Harada | 445/25 |
| 2006/0270304 | A1* | 11/2006 | Aita | 445/25 |
| 2009/0039780 | A1* | 2/2009 | Kim et al. | 313/512 |

FOREIGN PATENT DOCUMENTS

| JP | 2004-139977 | 5/2004 |
| JP | 2006-066364 | 3/2006 |

OTHER PUBLICATIONS

"Nikkei Electronics 2007" Sasaki Shinya, No. 960, pp. 10-11, Sep. 10, 2007 (and English translation thereof).

* cited by examiner

*Primary Examiner* — Toan Ton
*Assistant Examiner* — Andrew Coughlin
(74) *Attorney, Agent, or Firm* — Antonelli, Terry, Stout & Kraus, LLP.

(57) ABSTRACT

A mother element substrate and a mother seal substrate are adhered with each other via an adhesive sheet. An adhesive sheet cut portion of the adhesive sheet corresponding to a terminal portion is formed at a time when the adhesive sheet is applied to the mother seal substrate, thus requiring no processing of the terminal portion afterward. Since the adhesive sheet cut portion extends to reach an edge of the adhesive sheet to prevent deformation of the adhesive sheet around the terminal portion after adhering the mother element substrate and the mother seal substrate with each other under the negative pressure so as to be returned to the atmosphere, thus realizing the solid seal type organic EL display device with high reliability.

11 Claims, 13 Drawing Sheets

A-A

B-B

A-A

A-A

E-E

MANUFACTURING METHOD OF ORGANIC EL DISPLAY DEVICE

CLAIM OF PRIORITY

The present application claims priority from Japanese Patent Application JP 2008-205206 filed on Aug. 8, 2008, the content of which is hereby incorporated by reference into this application.

BACKGROUND OF THE INVENTION

1. Field of the Invention

The present invention relates to an organic EL display device, and more particularly, to a manufacturing method of a highly reliable organic EL display device which is capable of suppressing generation of a dark spot especially caused by moisture.

2. Description of the Related Art

Generally, an organic EL display device has an organic EL layer interposed between a pixel electrode (lower electrode) and an upper electrode. The fixed voltage is applied to the upper electrode and the data signal voltage is applied to the lower electrode to control emission of the organic EL layer so as to form the image. The data signal voltage is supplied to the lower electrode via a thin film transistor (TFT). The organic EL display device has two types: a bottom emission type for taking the light emitted from the organic EL layer along the direction of the glass substrate having the organic EL layer formed thereon; and a top emission type for taking the light along the direction opposite the glass substrate having the organic EL layer formed thereon.

The water contained in the organic EL material for forming the organic EL display device may deteriorate the emission property. The position with the deteriorated emission property due to the water no longer emits the light after a prolonged operation of the device. Such position becomes the dark spot on the display region, and grows over time to cause failure of the image. Such phenomenon as the edge growth having the non-luminous region increased around the pixel may also occur under the influence of the water.

In order to prevent generation or growth of the dark spot, it is necessary to prevent intrusion of water into the organic EL display device, or remove the intruded water. For this, the element substrate with the organic EL layer is sealed with the seal substrate via a seal disposed in the circumference thereof to prevent external intrusion of water into the organic EL display device. The inner sealed space is filled with such inert gas as $N_2$. Meanwhile, the desiccant is disposed inside the organic EL display device for dehumidifying the inner space thereof. The aforementioned organic EL display device is of hollow seal type.

The hollow seal type organic EL display device has problems of difficulty in adjustment of the gap between the element substrate and the seal substrate, difficulty in adjustment of the inside of the sealed portion, contamination of the organic EL material by the gas discharged from the sealing agent when sealing, and the low throughput.

The technique for protecting the organic EL material from water using the resin sheet with the predetermined film thickness interposed between the element substrate and the seal substrate is referred to as the solid sealing, which is used for solving the problems with respect to the hollow sealing.

JP-A No. 2004-139977 discloses the example of the solid sealing. FIGS. 12A to 12D show the structure disclosed in JP-A No. 2004-139977. Referring to FIGS. 12A to 12D, a light curable resin 104 on a light transmissive film 101 is applied to an element substrate 10 with an organic EL layer 22 using a pressure roller 105 heated at 80° C. Then the UV light is irradiated to cure the light curable resin 104 to peel the light transmissive film 101, thus providing the organic EL display device sealed with the light curable resin. The structure for covering the organic EL element with the silicon nitride film if needed is disclosed as well.

The article in "Nikkei Electronics 2007" Sasaki Shinya, No. 960, pp. 10-11, Sep. 10, 2007 discloses the following technique as shown in FIGS. 13A to 13E for sealing the organic EL display device. Specifically, a resin film 107 is applied to the portion of the seal substrate 40 corresponding to the organic EL element 103, and the seal agent 108 is applied around the resin film 107. Then the resin film 107 is used for bonding the seal substrate 40 having the seal agent 108 formed thereon, and the electrode substrate 10 having the organic EL element 103 formed thereon. The UV light is irradiated from the seal substrate 40 to conduct the thermal processing at the temperature in the range from 80° C. to 100° C. for curing the seal agent 108. Simultaneously, the resin film 107 with fluidity spreads over the space defined by the seal substrate 40, the element substrate 10, and the seal agent 108 to fill the defined space. The thus formed material is cut to have the respective organic EL display panels.

JP-A No. 2006-66364 discloses the structure for forming plural display elements on the mother panel, forming the sealing films for the respective display elements, and removing the protective film from the terminal by the laser abrasion. FIGS. 14A and 14B represents the structure disclosed in JP-A No. 2006-66364, in which plural display elements each with the light emitting portion 207 and the terminal portion 209 are formed on the mother panel 206 so as to be coated with the protective film 208. Then the protective film 208 at the portion 210 of the terminal portion 209 is eliminated by the laser abrasion to form the opening 210.

JP-A No. 2004-139977 discloses the structure for protecting the organic EL layer by applying the resin sheet to the respective organic EL display devices. The problem which occurs when the resin sheet is used for coating the plural organic EL panels formed on the mother panel to be separated is not described in the document.

In the Sasaki, it is important to balance the height of the resin film with that of the seal agent. If such balance is lost, the life of the organic EL display device may be shortened. The thermal process after sealing renders fluidity to the resin film to spread, which increases the pressure inside the organic EL display device to form the leak path leading to the outside, thus shortening the life of the organic EL display device. The influence of degasifying when the seal agent is cured to the resin sheet may deteriorate the sealing capability.

In the technology disclosed in JP-A No. 2006-66364, after applying the single resin sheet to the mother panel on which the plural organic EL display panels are formed, the opening is formed for removing the resin sheet for each terminal of the respective organic EL panels, resulting in low production capacity. The number of facilities has to be increased to expand the output, thus increasing the manufacturing cost. The use of high energy laser light rays for abrasion may cause the risk of damaging the connector terminal. The use of the laser to remove the resin sheet may also cause the risk of leaving the residue on the terminal.

SUMMARY OF THE INVENTION

It is an object of the present invention to provide an organic EL display device of solid seal type with high throughput and high sealing reliability.

The specific features of the invention will be described hereinafter.

(1) A manufacturing method of an organic EL display device includes the step of adhering a mother element substrate on which plural element substrates each having a display region and a terminal portion are formed to a mother seal substrate on which plural seal substrates are formed via an adhesive sheet. The adhesive sheet formed as a single continuous sheet includes an adhesive sheet cut portion which extends to reach an end portion of the adhesive sheet. The method further includes the steps of forming a mother panel by adhering the mother element substrate to the mother seal substrate at a portion other than the terminal portion formed on the element substrate corresponding to the adhesive sheet cut portion, and separating the mother panel into the organic EL display devices each having the element substrate and the seal substrate.

(2) In the method, the adhesive sheet is applied to a protective film as a roll type film.

(3) A manufacturing method of an organic EL display device includes the step of adhering a mother element substrate on which plural element substrates each having a display region and a terminal portion are formed to a mother seal substrate on which plural seal substrates are formed via an adhesive sheet. The adhesive sheet formed as a single continuous sheet includes an adhesive sheet cut portion which extends to reach an end portion of the adhesive sheet. The method further includes the steps of forming a mother panel by adhering the mother element substrate to the mother seal substrate at a portion other than the terminal portion formed on the element substrate corresponding to the adhesive sheet cut portion while performing the adhesion under a negative pressure atmosphere, keeping the adhesive sheet cut portion of the adhesive sheet in the mother panel communicated with the atmosphere, and separating the mother panel into the organic EL display devices each having the element substrate and the seal substrate.

(4) A manufacturing method of an organic EL display device includes the steps of forming a mother panel by adhering a mother element substrate on which plural element substrates each having a display region and a terminal portion are formed to a mother seal substrate on which plural seal substrates are formed via an adhesive material, printing an adhesive surface on the mother seal substrate to have a continuous surface and forming an adhesive material cut portion in the adhesive surface to extend to reach an end portion thereof, disposing the adhesive surface formed on the mother seal substrate on the display region of the element substrate formed on the mother element substrate to form the mother panel by adhering the mother element substrate to the mother seal substrate to dispose the adhesive material cut portion at the terminal portion of the element substrate formed on the mother element substrate, and separating the mother panel into the organic EL display devices each having the element substrate and the seal substrate.

(5) In the method, the mother seal substrate and the mother element substrate are adhered with each other under a negative pressure atmosphere.

An adhesive sheet is adhered to the mother seal substrate corresponding to the region where plural display regions are formed on the mother element substrate. The adhesive sheet is not formed at the position corresponding to the terminal portion of the mother element substrate. The adhesive sheet does not have to be removed from the terminal portion after separating the respective organic EL display devices from the mother panel formed by adhering the mother element substrate and the mother seal substrate. This may get rid of the risk of damaging the terminal portion when removing the adhesive material therefrom. This may also prevent the residue of the adhesive material left in the terminal portion.

In the present invention, an adhesive sheet cut portion is formed in the adhesive sheet to extend to the edge thereof. In the case where the mother element substrate and the mother seal substrate are adhered under the negative pressure atmosphere so as to be returned to the atmosphere, deformation of the adhesive sheet at the terminal portion owing to the pressure change may be prevented. This makes it possible to realize the organic EL display device of solid seal type with high reliability.

DETAILED DESCRIPTION OF THE PREFERRED EMBODIMENTS

Figure 1:
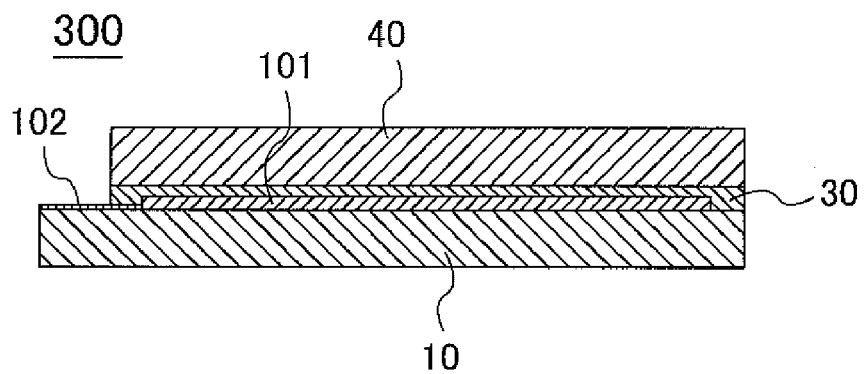
FIG. 1 is a sectional view of an organic EL display device according to the present invention.

The structure of the organic EL display device to which the present invention is applied will be described before explaining the specific embodiments of the present invention. FIG. 1 is a sectional view of an organic EL display panel 300 which forms the organic EL display device according to the present invention. Referring to FIG. 1, a display region 101 provided with an organic EL layer for displaying the image and a thin film transistor (TFT) for driving is formed on an element substrate 10 in matrix.

An adhesive sheet 30 is formed to cover the display region 101 for sealing. A seal substrate formed of the glass is adhered to an element substrate by the adhesive sheet. As the adhesive sheet 30, the thermal curing epoxy resin material may be used. The thickness of the adhesive material is in the range from 10 μm to 20 μm. Besides the epoxy resin, the acrylic resin or the silicon resin may be employed as the adhesive sheet 30.

Preferably, the adhesive sheet 30 exhibits moisture impermeability. However, it does not have to exhibit strong barrier feature against water as the seal substrate 40 formed of the glass material assumes a major function as the barrier against water. In the structure as shown in FIG. 1, intrusion of water from above may be blocked by the glass seal substrate 40. Water intruded from the side has to pass the long distance to reach the organic EL layer.

A terminal portion 102 of the display region 101 on the element substrate 10 extends from the edge, through which power, video signals and the like are supplied to the organic EL layer. The terminal portion 102 is not coated with the adhesive material. However, since the wiring is coated with an inorganic passivation film or an organic passivation film, the conductive film of the terminal portion 102 is kept uncorroded. The conductive film is less affected by water compared with the organic EL layer.

FIG. 1 represents an example of so called the solid sealing having no space between the seal substrate 40 and the element substrate 10. Unlike the hollow sealing, no black spot is generated by the seal substrate 40 pressed to be in contact with the element substrate 10. This may further prevent various problems caused by the inner pressure of the seal gas for the sealing operation.

In the present invention, the organic EL display panels 300 as shown in FIG. 1 are formed on a mother panel 200. The large-sized adhesive sheet 30 is applied to a mother seal substrate 400 so as to be adhered to the mother element substrate 100. In the present invention, the adhesive sheet 30 is applied to the display region 101, but is not applied to the terminal portion 102.

Figure 2:
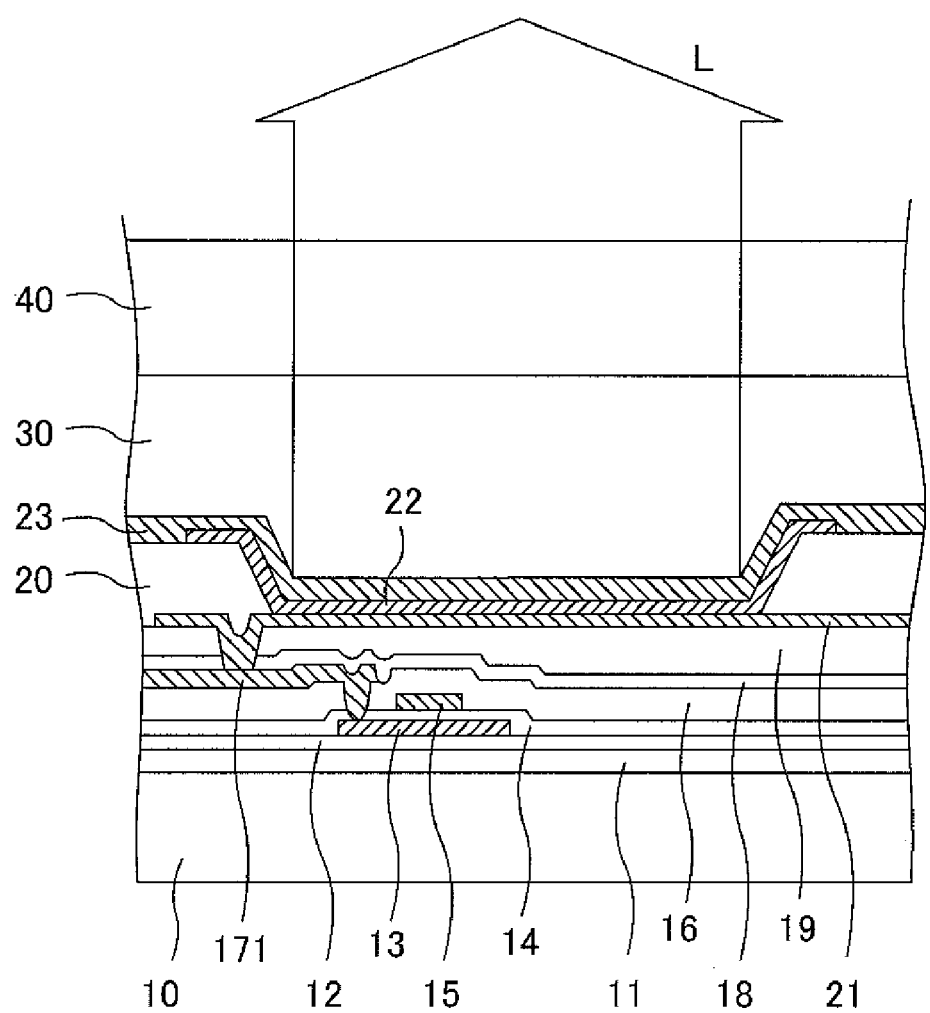
FIG. 2 is a sectional view of a display region of an organic EL display panel according to the present invention.

FIG. 2 is a sectional view of the display region of the organic EL display device of top emission type to which the present invention is applied. In the embodiment, the organic EL display device of top emission type will be described hereinafter. However, it is to be clearly understood that the present invention is also applicable to the organic EL display device of bottom emission type. The organic EL display device of top emission type includes a top anode type having an anode on the organic EL layer, and a top cathode type having a cathode on the organic EL layer. FIG. 1 represents the top anode type. However, the present invention is applicable to the top cathode type as well.

Referring to FIG. 2, a first base film 11 formed of SiN and a second base film 12 formed of $SiO_2$ are laminated on the element substrate 10 for preventing the impurity substance of the glass substrate from contaminating a semiconductor layer 13 formed on the second base film 12. The semiconductor layer 13 has an a-Si film formed through the CVD process, which then will be converted into poly-Si film through laser irradiation.

A gate insulating film 14 as $SiO_2$ is formed to cover the semiconductor layer 13. A gate electrode 15 is formed opposite the semiconductor layer 13 so as to interpose the gate insulating film 14 therebetween. The impurity substance such as phosphorus or boron is ion implanted into the semiconductor layer 13 using the gate electrode 15 as the mask. Then the conductivity is applied to form a source region or a drain region on the semiconductor layer 13.

An inter-layer insulating film 16 is formed of $SiO_2$ to cover the gate electrode 15 so as to insulate the gate wiring from a drain wiring 171 formed on the inter-layer insulating film 16. The drain wiring 171 is connected to the drain of the semiconductor layer 13 via through holes of the inter-layer insulating film 16 and the gate insulating film 14.

An inorganic passivation film 18 formed of SiN is applied to protect the thus produced thin film transistor (TFT). An organic passivation film 19 is formed on the inorganic passivation film 18 to protect the TFT completely together with the inorganic passivation layer 18, and to further flatten the surface on which the organic EL layer 22 is formed. The organic passivation film 19 is formed to be thick in the range from 1 to 4 μm.

A reflection electrode 24 as Al or an Al alloy is formed on the organic passivation film 19. The Al or the AL alloy is suitable for forming the reflection electrode 24 because of high reflectance. The reflection electrode 24 is connected to the drain wiring 171 via the through holes formed in the organic passivation film 19 and the inorganic passivation film 18.

The embodiment is formed as the organic EL display device of top anode type, and accordingly, the lower electrode 21 of the organic EL layer 22 becomes the cathode. The Al or the Al alloy employed as the reflection electrode 24 may be used as the lower electrode 21 of the organic EL layer 22. Since the work function of the Al or the Al alloy is relatively small, it may function as the cathode.

The organic EL layer 22 is formed on the lower electrode 21. The organic EL layer 22 is formed by laminating an electron transport layer, an emission layer and a hole transport layer from the lower side. An electron injection layer may be formed between the electron transport layer and the lower electrode 21. A hole injection layer may also be formed between the hole transport layer and the upper electrode 23. The upper electrode 23 to serve as the anode is formed on the organic EL layer 22. In the embodiment, IZO is employed as the upper electrode 23. The IZO is deposited over an entire display region without using the mask, and has the thickness of approximately 30 nm for maintaining the light transmittance. Instead of the IZO, ITO may be employed.

Any material may be employed as the electron transport layer so long as it exhibits the electron transport capability and is deposited together with the alkaline metal to facilitate the charge-transfer complexation. For example, such metal complex as tris(8-quinolinolate)aluminum, tris(4-methyl-8-quinolinolate)aluminum, bis(2-methyl-8-quinolinolate)-4-phenylphenolate-aluminum, bis[2-[2-hydroxiphenyl]benzooxazolate]zinc, and 2-(4-biphenyl)-5-(4-tert-butylphenyl)-1,3,4-oxadiazol, 1,3-bis[5-(p-tert-butylphenyl)-1,3,4-oxadiazol-2-il]benzene may be employed.

Any material may be employed for forming the emission layer so long as the dopant with fluorescence or phosphorescence is added to the host material with the hole transport capability so as to be formed as the emission layer through the co-deposition through recombination. For example, as the host, the complex, an anthracene derivative, carbazole derivative such as tris(8-quinolinolate)aluminum, bis(8-quinolinolate)magnesium, bis(benzo{f}-8-quinolinolate)zinc, bis(2-methyl-8-quinolinolate)aluminum oxide, tris(8-quinolinolate)indium, tris(5-methyl-8-quinolinolate)aluminum, 8-quinolinolate lithium, tris(5-chloro-8-quinolinolate)gallium, bis(5-chloro-8-quinolinolate)calcium, 5,7-dichlor-8-quinolinolate aluminum, tris(5,7-dipromo-8-hydroxyquinolinolate)aluminum, poly[zinc(II)-bis(8-hydroxy-5-quinolinyl)methane] may be employed.

Any material for forming the dopant may be employed so long as it traps the electron and hole in the host to be recombined for emitting, for example, a pyran derivative for the red light, a coumarin derivative for the green light, and anthracene derivative for the blue light. Alternatively, the material for emitting the phosphorescence such as an iridium complex and pyridinate derivative may also be employed.

As the hole transport layer, for example, tetraaryl benzidine compound (triphenyldiamine: TPD), aromatic tertiary amine, hydrazone derivative, carbazole derivative, triazole derivative, imidazole derivative, oxadiazole derivative with amino group, polythiophene derivative, copper phthalocyanine derivative and the like may be employed.

A bank 20 is formed between adjacent pixels for preventing rupture of the organic EL layer 22 upon cutting at the end portion. The bank 20 may be formed of the organic material, or formed of the inorganic material such as SiN. When employing the organic material, the acrylic resin is generally employed.

An auxiliary electrode may be applied onto the upper electrode 23 on the bank 20 for supporting conduction to cope with the uneven luminance due to high resistance of the upper electrode 23. In the embodiment, the auxiliary electrode is not employed. It is to be understood that the present invention is applicable to the organic EL display device which employs the auxiliary electrode. The adhesive sheet 30 is formed on the upper electrode, which is formed of the thermosetting epoxy resin for adhering the element substrate 10, specifically, the glass and the seal substrate 40 formed of the upper electrode and the glass. The thickness of the adhesive sheet 30 is in the range from 10 μm to 20 μm. The seal substrate 40 is adhered to the adhesive sheet 30 so as to protect the organic EL layer from water.

The following embodiments according to the present invention will be described in detail.

First Embodiment

FIGS. 3A to 4B represent an adhesive film 35 having a sheet-like adhesive material 30 to be used in the present invention protected by the protective films 36. In the description, both a large-sized mother adhesive sheet which exists on the mother panel and the adhesive sheet which exists on the respective organic EL display panels will be referred to as the adhesive sheet 30.

Figure 3A:
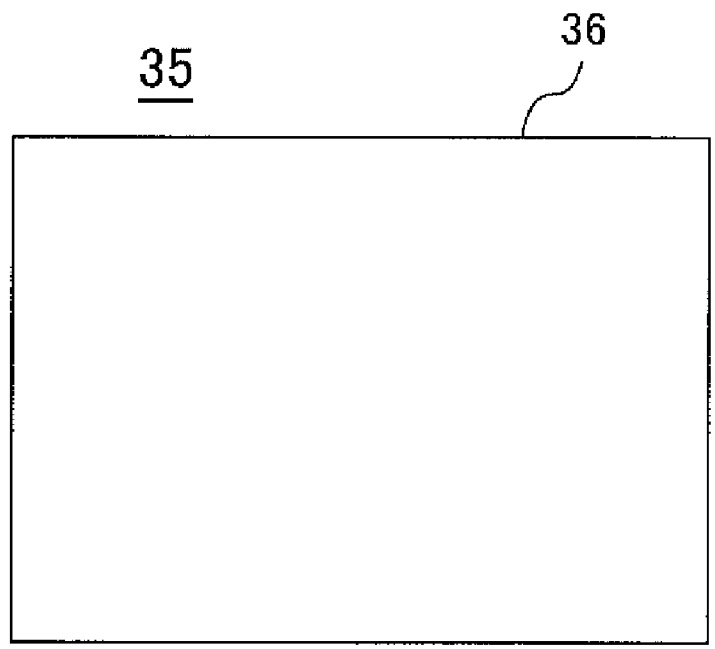
FIGS. 3A and 3B show an unprocessed adhesive film.
Figure 3B:
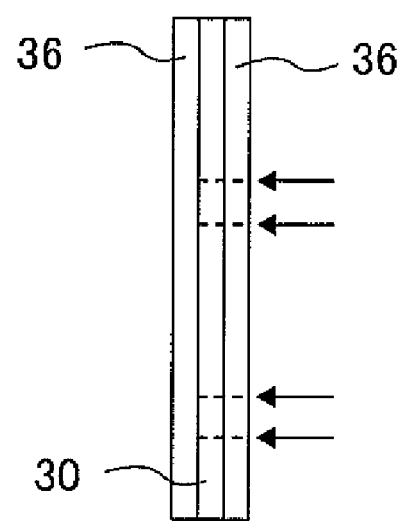

FIGS. 3A and 3B show the large-sized adhesive film 35. Referring to FIGS. 3A and 3B, the large adhesive sheet 30 is sandwiched between the large PET protective films 36. The adhesive film 35 is partially cut in the direction indicated by arrows in FIG. 3B to remove the cut portion of the adhesive film 35.

Figure 4A:
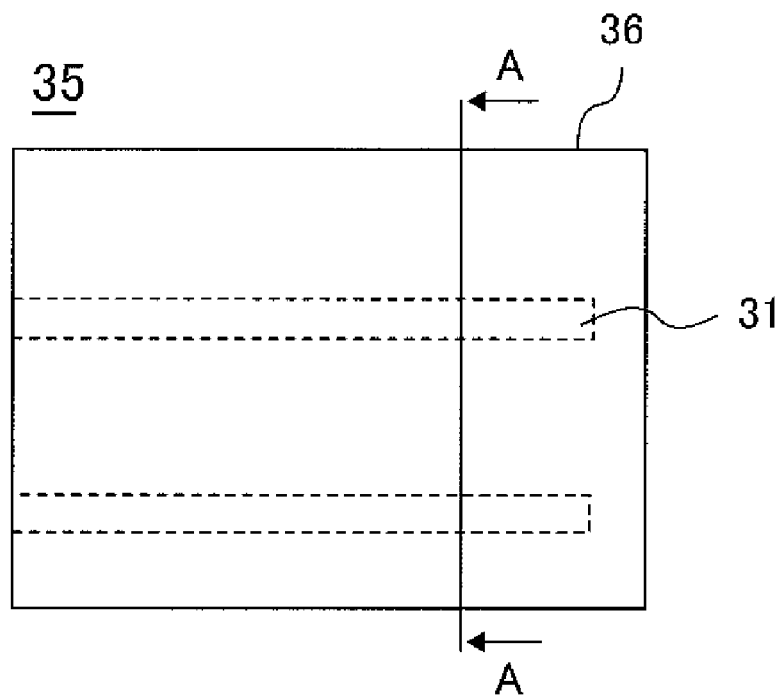
FIGS. 4A and 4B show an adhesive film according to a first embodiment.
Figure 4B:
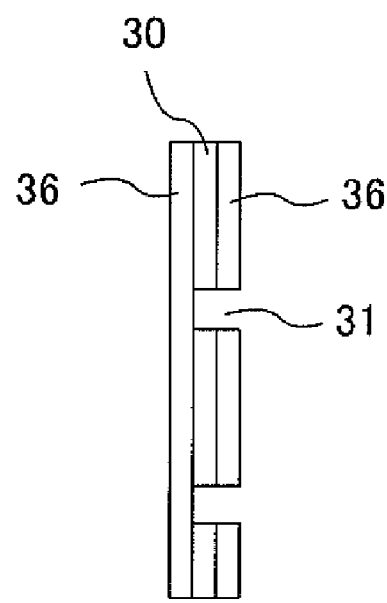

FIGS. 4A and 4B show the adhesive film 35 having portions cut and removed. FIG. 4A is a plan view, and FIG. 4B is a sectional view taken along line A-A of FIG. 4A. FIG. 4A shows the surface of the protective film 36 having the adhesive sheet 30 adhered to the back side partially removed in the longitudinal direction. FIG. 4B is a sectional view of the protective film 35 having an adhesive sheet cut portion 31 formed therein.

FIG. 4A shows the characteristic of the present invention, that is, the adhesive sheet cut portion 31 reaches the left edge of the adhesive sheet 30. This may prevent the adhesive sheet 30 around the terminal portion from being irregularly shaped by deformation of the adhesive sheet cut portion 31 after adhering the mother seal substrate 400 to which the adhesive sheet 30 is applied to the mother element substrate 100 in the reduced pressure atmosphere so as to be returned to the atmosphere.

The protective film 36 at the back side is removed as shown in FIG. 4B, and the adhesive sheet 30 is applied to the seal substrate 40 under the reduced pressure at the temperature of approximately 80° C. so as not to contain bubbles. At the temperature of approximately 80° C., the adhesive sheet 30 is not sufficiently solidified, but exhibits adhesiveness sufficient to adhere the seal substrate 40 to the adhesive sheet 30 with the strength at a certain level.

Figure 5A:
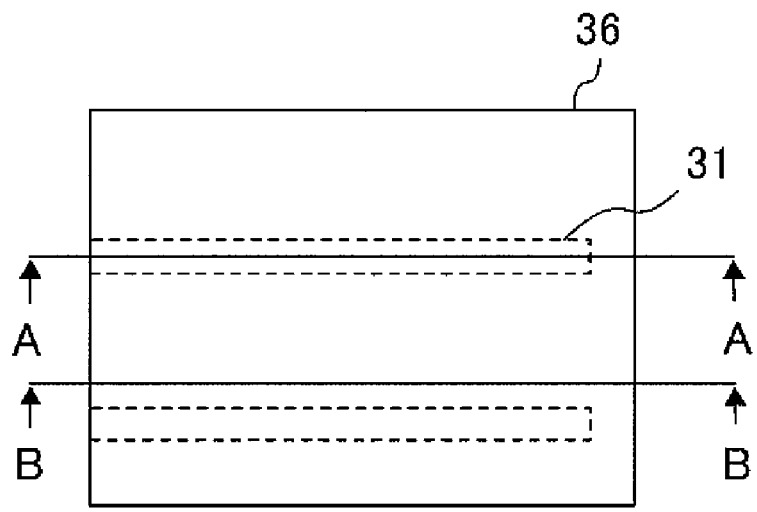
FIGS. 5A to 5C represent that the adhesive sheet with a protective film according to the first embodiment is adhered to a mother seal substrate.

FIG. 5A shows the state where the adhesive sheet 30 shown in FIGS. 4A and 4B is adhered to the mother seal substrate 40.

Figure 5B:
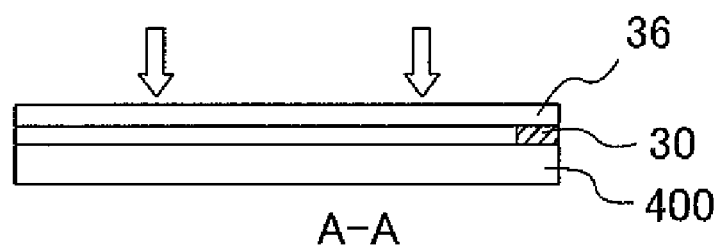
Figure 5C:
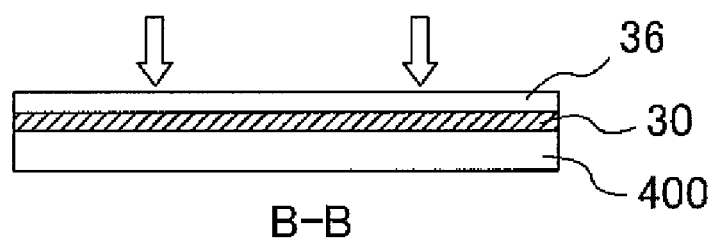

FIG. 5A shows the surface of the protective film 36 which covers the adhesive sheet 30. The dashed line shown in FIG. 5A indicates a longitudinally formed cut portion 31 of the adhesive sheet 30. FIG. 5B is a sectional view taken along line A-A of FIG. 5A, showing the cut portion of the adhesive sheet 30. At this portion, the adhesive sheet 30 is sandwiched between the protective film 36 and the mother seal substrate 400 only at the left side. FIG. 5C is a sectional view taken along line B-B of FIG. 5A, showing the adhesive sheet 30 sandwiched between the protective film 36 and the seal substrate 400.

Figure 6A:
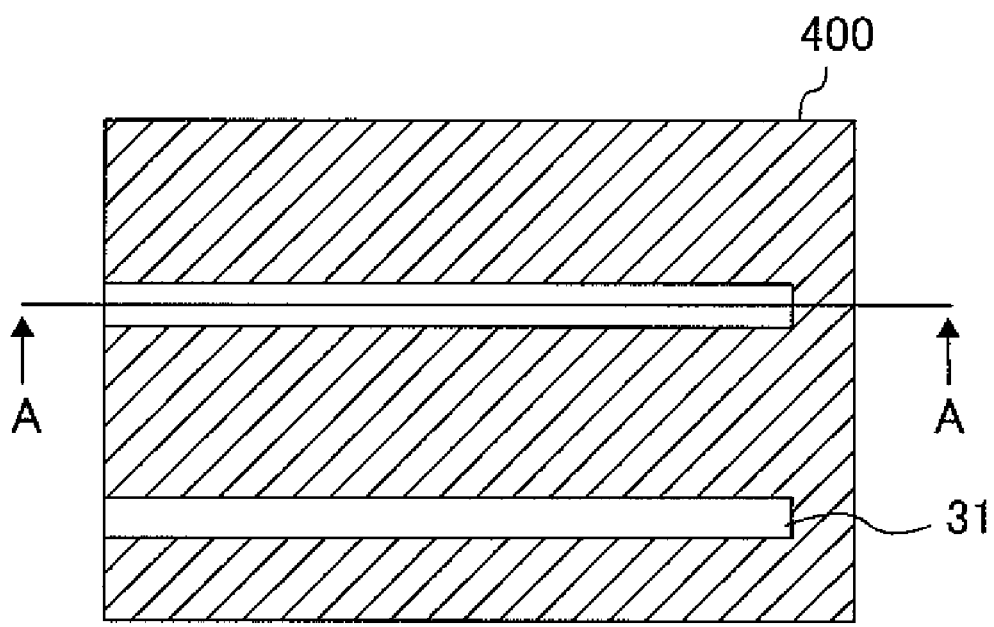
FIGS. 6A and 6B represent that the adhesive sheet according to the first embodiment is adhered to the mother seal substrate.
Figure 6B:
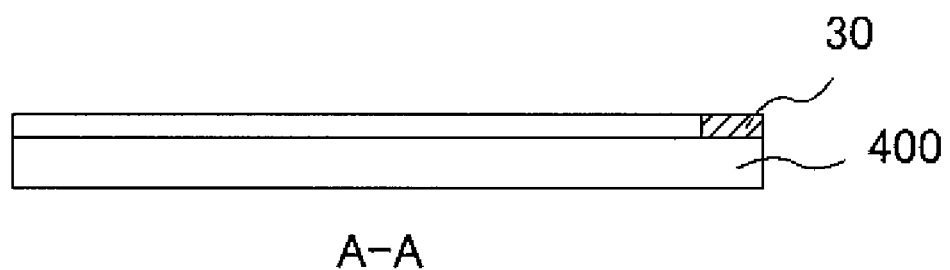

FIGS. 6A and 6B show the state where the adhesive sheet 30 is adhered to the mother seal substrate 400 having the protective film 36 shown in FIGS. 5A to 5C peeled off. FIG. 6A is a plan view showing the state where the protective film is applied onto the mother seal substrate 400 on which the seal substrates 40 are formed. FIG. 6B is a sectional view taken along line A-A of FIG. 6A. The mother seal substrate 400 is entirely covered with the adhesive sheet 30 except the longitudinal cut portion 31 corresponding to the terminal portion 102 to be formed on the element substrate 10. The longitudinal cut portion 31 reaches the left edge.

Figure 7:
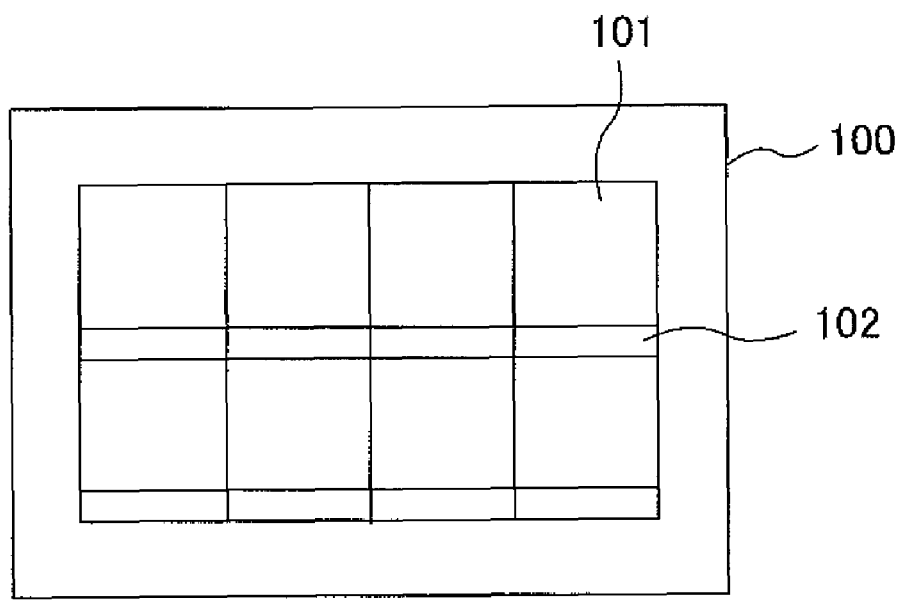
FIG. 7 is a plan view of a mother element substrate.

FIG. 7 is a plan view of the mother element substrate 100 on which eight element substrates 10 are formed. Each of the element substrates 10 has a display region 101 and a terminal portion 102 formed thereon. As the characteristic of the present invention, the terminal portion 102 of the mother element substrate 100 shown in FIG. 7 corresponds to the adhesive sheet cut portion 31 of the mother seal substrate 400 shown in FIG. 6A.

Figure 8A:
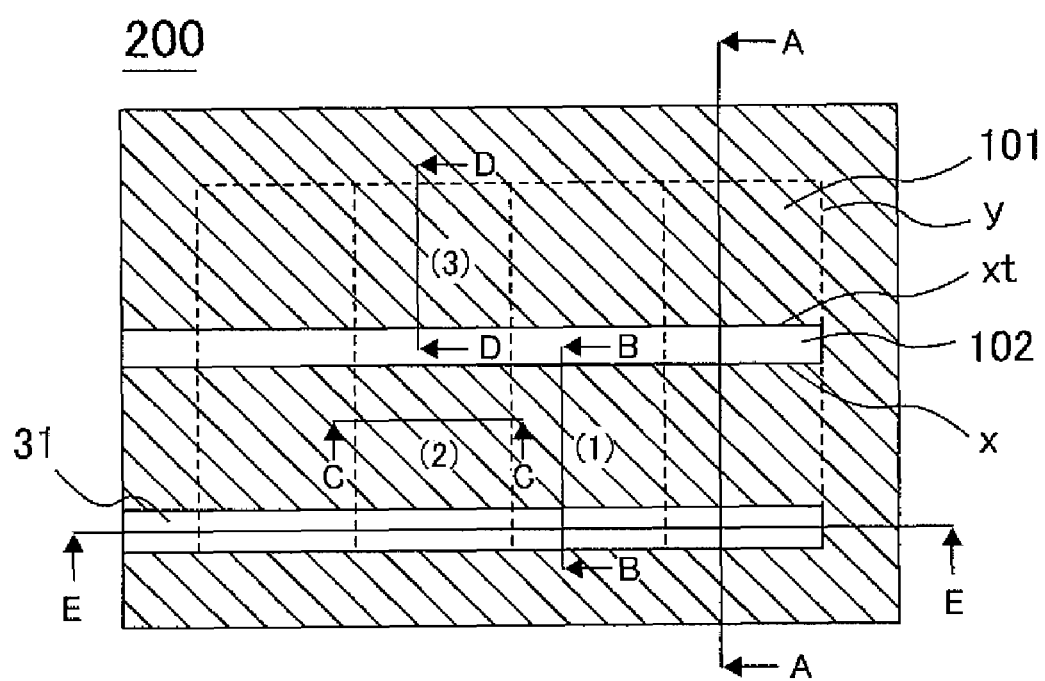
FIGS. 8A to 8C show a mother panel according to the first embodiment.
Figure 8B:
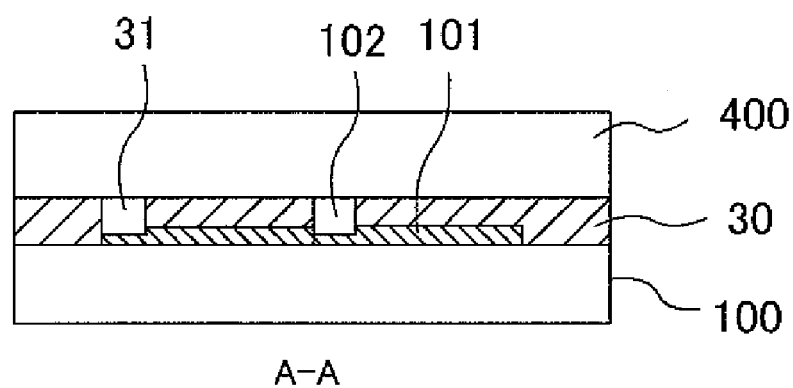
Figure 8C:
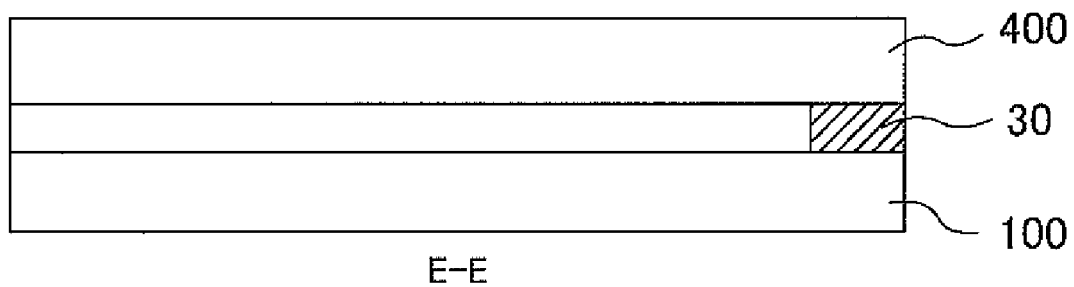

FIGS. 8A to 8C show the mother panel 200 formed by adhering the mother seal substrate 400 shown in FIGS. 6A and 6B to the mother element substrate 100 shown in FIG. 7 via the adhesive sheet 30. FIG. 8A is a plan view showing the mother panel 200 seen from the seal substrate 40. FIG. 8B is a sectional view taken along line A-A of FIG. 8A. FIG. 8C is a sectional view taken along line E-E of FIG. 8A. The mother seal substrate 400 and the mother element substrate 100 are adhered with each other under the reduced pressure atmosphere while pressurizing the mother seal substrate 400 with respect to the mother element substrate 100 in the heated condition. The heating at 100° C. will be performed for two hours, and at 120° C. will be performed for 30 minutes, respectively. The adhesive sheet 30 is cured by the heating such that the mother seal substrate 400 is strongly adhered to the mother element substrate 100, which may prevent intrusion of moisture from the interface.

Referring to FIGS. 8A to 8C, the adhesive sheet cut portion 31 reaches the left edge of the mother panel 200. The inner pressure of the adhesive sheet cut portion 31 is the same as the outer pressure under the negative pressure atmosphere or the atmospheric pressure. If both sides of the adhesive sheet cut portion 31 are closed as shown by the right side of FIG. 8A, the following problem may occur. Under the negative pressure atmosphere, the mother element substrate 100 is adhered to the mother seal substrate 400 via the adhesive sheet 30 so as to be returned to the atmosphere. The adhesive sheet cut portion 31 is kept at the negative pressure, and accordingly, the adhesive sheet 30 is pressurized under the atmospheric pressure to deform the adhesive sheet cut portion 31. As the adhesive sheet cut portion 31 exposes the terminal portion 102, the adhesive sheet 30 which covers the periphery of the terminal portion is deformed to influence conduction of the terminal portion 102. In the aforementioned case, the adhesive sheet 30 may be peeled off from the deformed portion.

Meanwhile, in the case where the adhesive sheet cut portion 31 of the adhesive sheet 30 is formed to reach its edge in the present invention, air is allowed to flow into the adhesive sheet cut portion 31 even after adhesion of the mother seal substrate 400 and the mother element substrate 100 so as to be returned into the atmospheric pressure. The pressure balance may be kept, thus preventing deformation of the adhesive sheet cut portion 31.

A shaded region of FIG. 8A represents the area where the adhesive sheet 30 is applied. Referring to FIG. 8B, the adhesive sheet 30 is applied onto the display region 101 formed on the mother element substrate 100. The mother seal substrate 400 is further adhered onto the adhesive sheet 30. Meanwhile, the adhesive sheet 30 is not formed on the terminal portion 102 of the mother element substrate 100. There is neither adhesive sheet 30 nor the seal substrate 40 on the terminal portion 102 after separating the respective organic EL display devices from the mother panel 200.

After adhesion of the mother element substrate 100 to the mother seal substrate 400, scribing is formed along dashed lines y and x from the side of the mother element substrate 100 as shown in FIG. 8A. The scribing is further formed from the side of the mother seal substrate 400 along the line xt. Then impact is exerted to the glass from the side of the mother element substrate 100, the mother panel 200 is cut along the dashed lines x and y, and the respective organic EL display devices are separated. When the impact is exerted to the glass from the side of the seal substrate 40 along the scribing xt after separating the organic EL display panels 300, the seal substrate 40 on the terminal portion 102 is ruptured and removed so as to expose the terminal portion 102 of the element substrate 10.

Figure 9A:
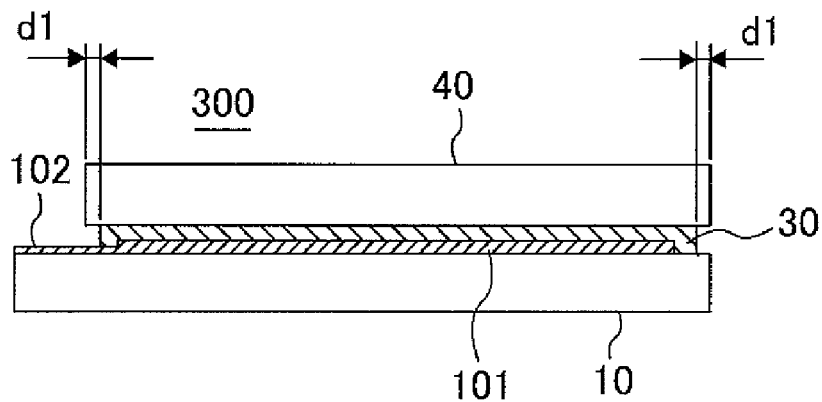
FIGS. 9A to 9C are sectional views of the organic EL display panel formed in the first embodiment.
Figure 9B:
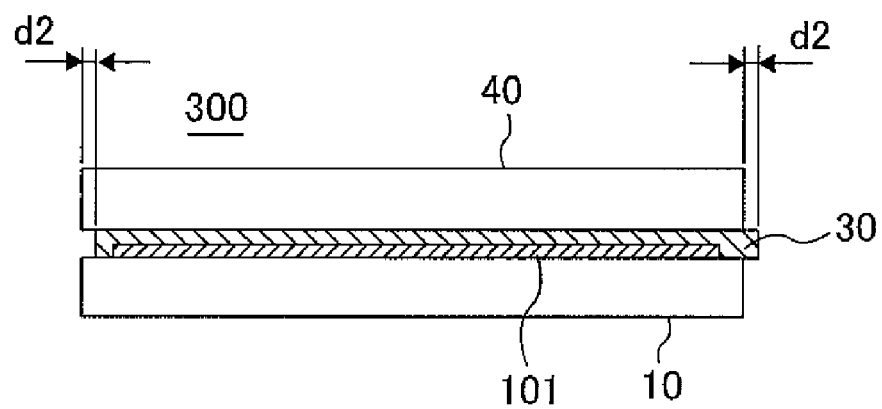
Figure 9C:
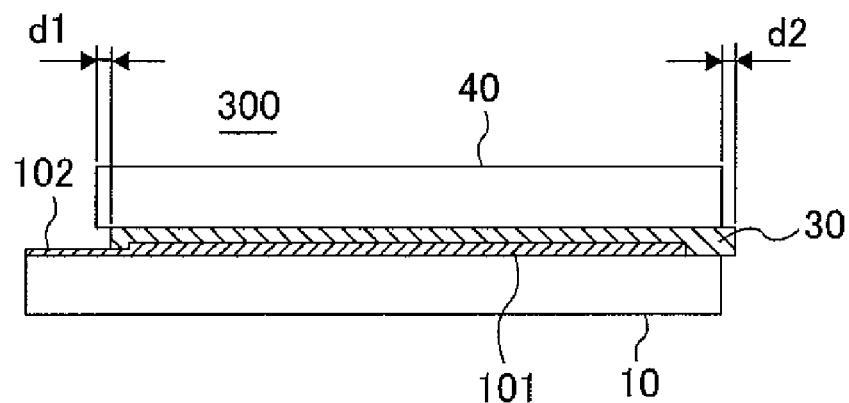

Each of the organic EL display panels 300 is separated from the mother panel 200 in the aforementioned process, and has a different cross section depending on the separated location. FIGS. 9A to 9C show cross sections of the organic EL display panel 300 which are different depending on the cut location. FIG. 9A is a sectional view of the organic EL display panel (1) cut from the mother panel 200 taken along line B-B of FIG. 8A. Referring to FIG. 9A, the adhesive sheet 30 is retracted inward from the edge of the seal substrate 40 by a distance d1.

In the case of the portion having the cross section taken along line B-B, the adhesive sheet 30 is partitioned with the preliminarily formed cut portion 31, which allows the distance d1 to be designed in advance. In other words, it is possible to design the adhesive sheet 30 to be constantly located in the retracted position from the breakage surface of the seal substrate 40 or the element substrate 10. That is, the distance d1 shown in FIG. 9A may be set to 0 or larger. Generally, the adhesive sheet 30 may change its composition, based on which the distance d1 is set to approximately 0.5 mm.

FIG. 9B is a sectional view of the organic EL display panel (2) separated from the mother panel 200 taken along line C-C of FIG. 8A. Referring to FIG. 9B, the end of the organic EL display panel 300 shows the respective breakage surfaces of the seal substrate 40, the adhesive sheet 30, and the element substrate 10. The element substrate 10 and the seal substrate 40 are formed of glass materials, and the adhesive sheet 30 is formed of the resin material. Accordingly, the breakage process of the respective sections may be different, resulting in the irregular shape as a result of combining the ends of the glass and the adhesive sheet 30.

Referring to FIG. 9B, the adhesive sheet 30 extends from the right edge of the glass by a distance d2. The extension amount is approximately 0.2 mm. Meanwhile, the adhesive sheet 30 is in the retracted position from the glass edge by the distance of 0.2 mm. The aforementioned state represents that upon breakage of the adhesive sheet 30, its end is pulled by the adjacent organic EL display panel 300. FIG. 9B shows an example that the adhesive sheet 30 extends at the right edge and retracts from the left edge. For example, there may be the case opposite the aforementioned example, or the case having both ends extended. In the aforementioned method, the distance d2 may be positive or negative by approximately 0.2 mm.

FIG. 9C is a sectional view of the organic EL display panel (3) separated from the mother panel 200 taken along line D-D of FIG. 8A. Referring to FIG. 9C, the adhesive sheet 30 is in the retracted position at the left side, that is, from the edge of the seal substrate 40. The aforementioned portion may be controlled as described referring to FIG. 9A. Meanwhile, at the right side, that is, the side opposite the terminal portion 102, the adhesive sheet 30 extends outward from the seal substrate 40. The breakage surface of the adhesive sheet 30 is not predictable as described referring to FIG. 9B. The distance d2, thus, may take a negative value of approximately 0.2 mm. The manufacturing method according to the present invention provides the characteristic that the positional relationship of the end of the adhesive sheet 30 with respect to the edge of the seal substrate 40 or the element substrate 10 varies depending on the cross section of the organic EL display panel 300.

Second Embodiment

Figure 10:
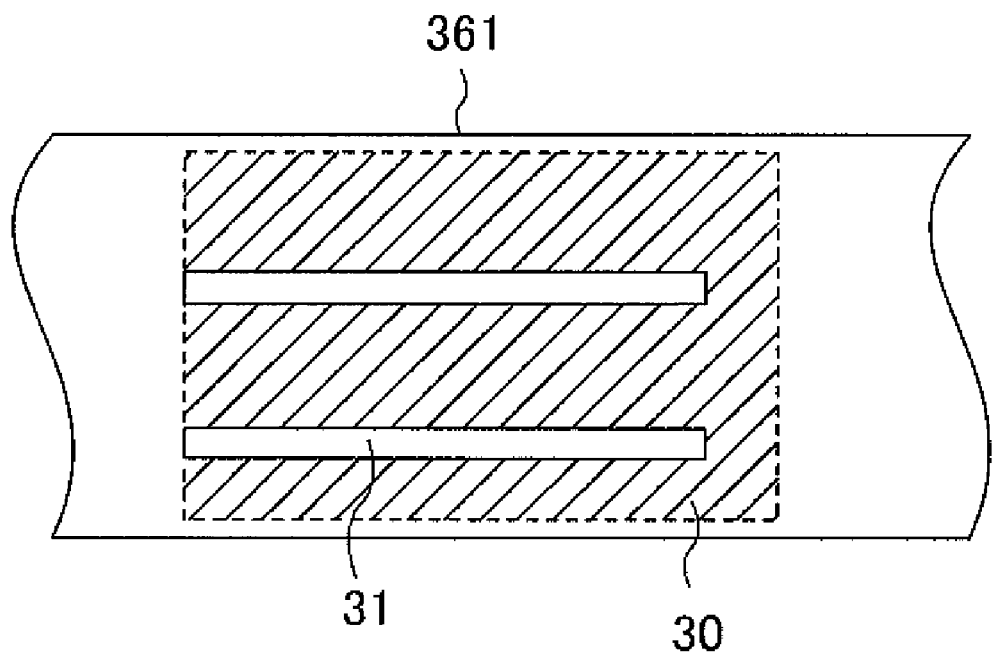
FIG. 10 represents an example of an adhesive file of roll type according to a second embodiment.

As described in the first embodiment, the adhesive sheet 30 may be applied to each of the mother seal substrates 400. Such process is relatively inefficient from the aspect of mass-production because such process needs the space with the certain size for manufacturing. FIG. 10 shows the method for solving the aforementioned problem.

FIG. 10 represents an example where a large number of the adhesive sheets 30 according to the first embodiment are applied to the protective film 36 to form a roll type film 361. Referring to FIG. 10, the dashed line indicates an outline of the mother seal substrate 400. The roll type film 361 is supplied from the left side in FIG. 10, for transferring the adhesive sheet 30 to the mother seal substrate 400. After the transfer, the protective sheet is rewound at the right side.

Referring to FIG. 10, the adhesive sheet cut portion 31 is formed to reach the left edge of the adhesive sheet 30. This makes it possible to avoid the problem that the adhesive sheet 30 around the terminal portion deforms owing to the external atmospheric pressure change upon adhesion of the mother seal substrate 400 to the mother element substrate 100.

The structure as shown in FIG. 10 allows the adhesive sheet 30 to be applied to a large number of the mother panels efficiently. The large manufacturing place is not required as the sheet is rewound by the roll.

Third Embodiment

In the first and the second embodiments, the element substrate 10 and the seal substrate 40 are adhered using the adhesive sheet 30, and simultaneously, the adhesive sheet 30 is allowed to perform moisture prevention function. In the embodiment, the adhesive sheet 30 is not used as the adhesive material. An adhesive material 38 is applied to be directly printed on the mother seal substrate 400.

Figure 11:
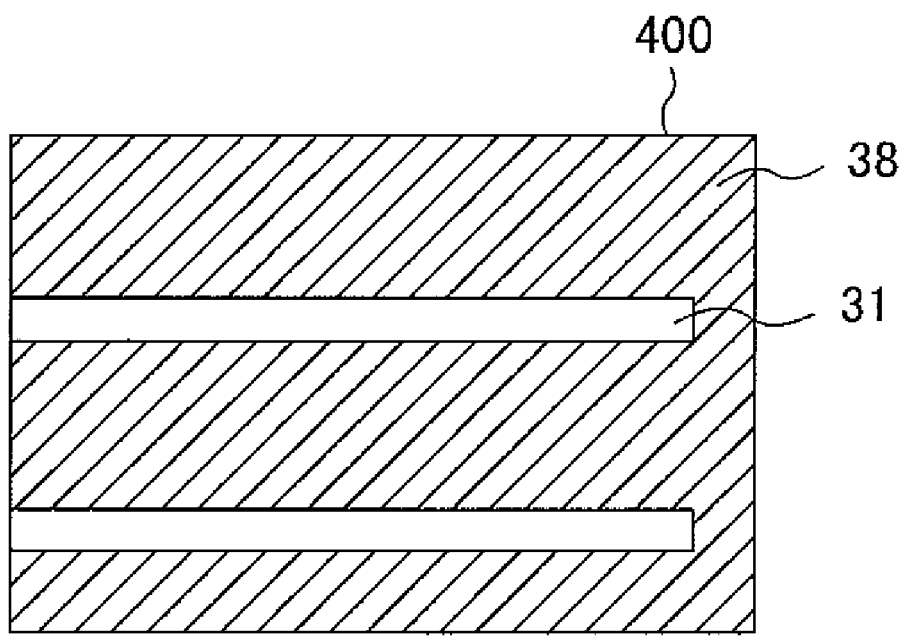
FIG. 11 shows an example for printing an adhesive material on the mother seal substrate.
Figure 12A:
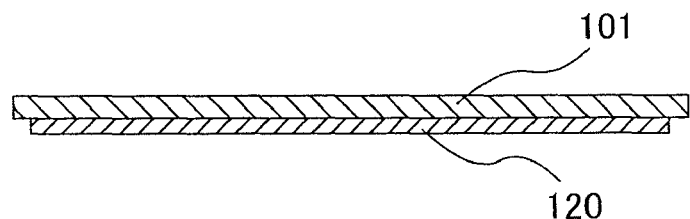
FIG. 12A to 12D represent a related art disclosed in JP-A No. 2004-139977.
Figure 12B:
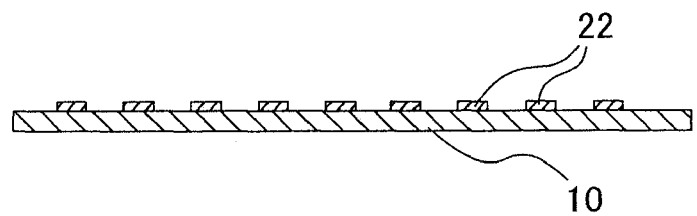
Figure 12C:
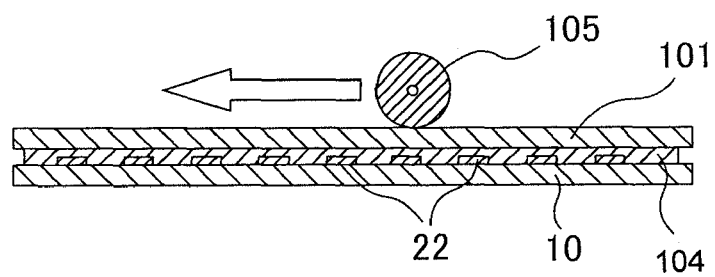
Figure 12D:
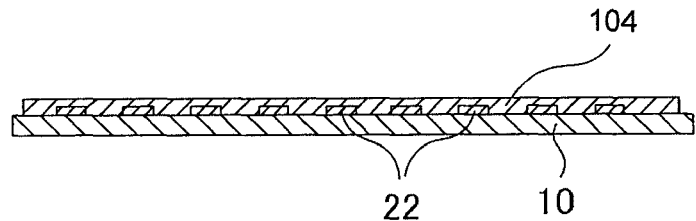
Figure 13A:
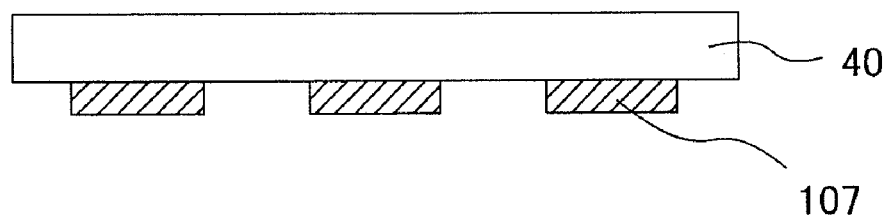
FIG. 13A to 13E represent another related art disclosed in the Sasaki.
Figure 13B:
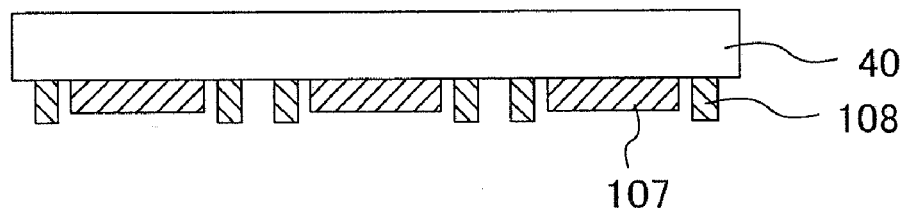
Figure 13C:
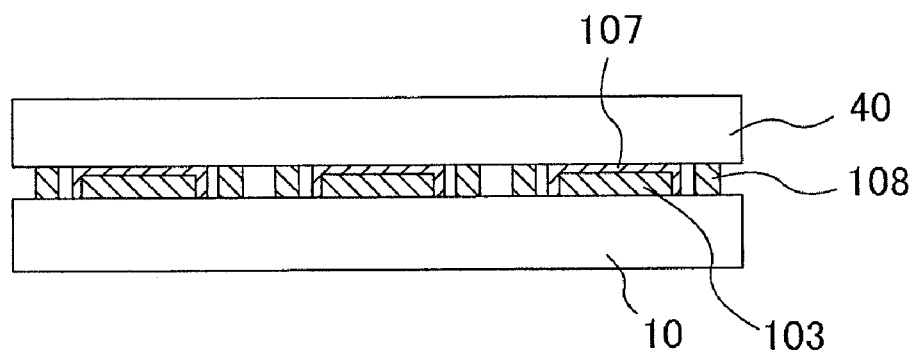
Figure 13D:
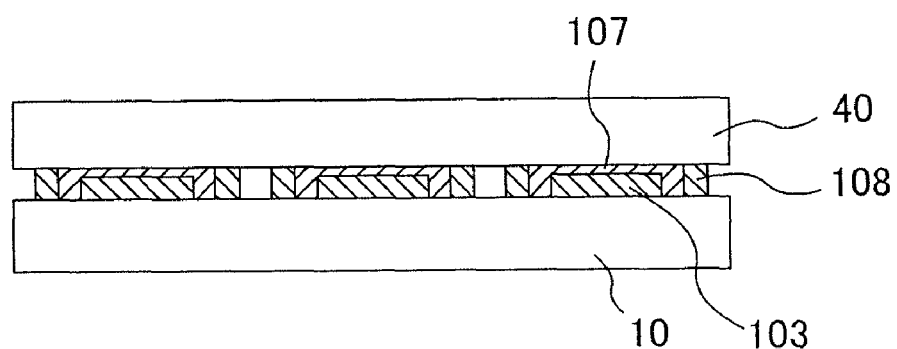
Figure 13E:
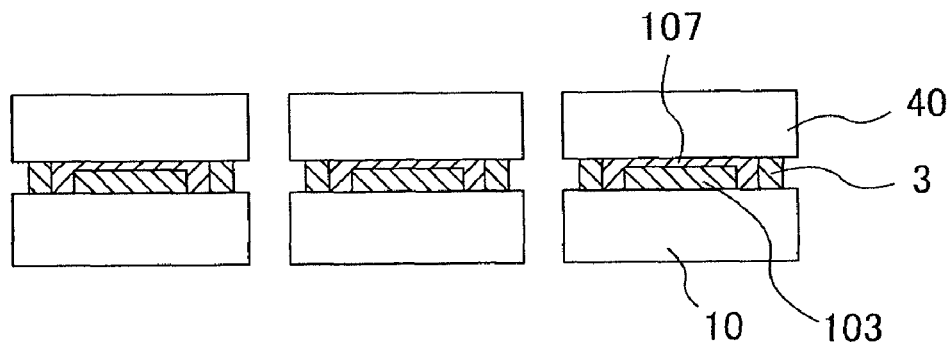
Figure 14A:
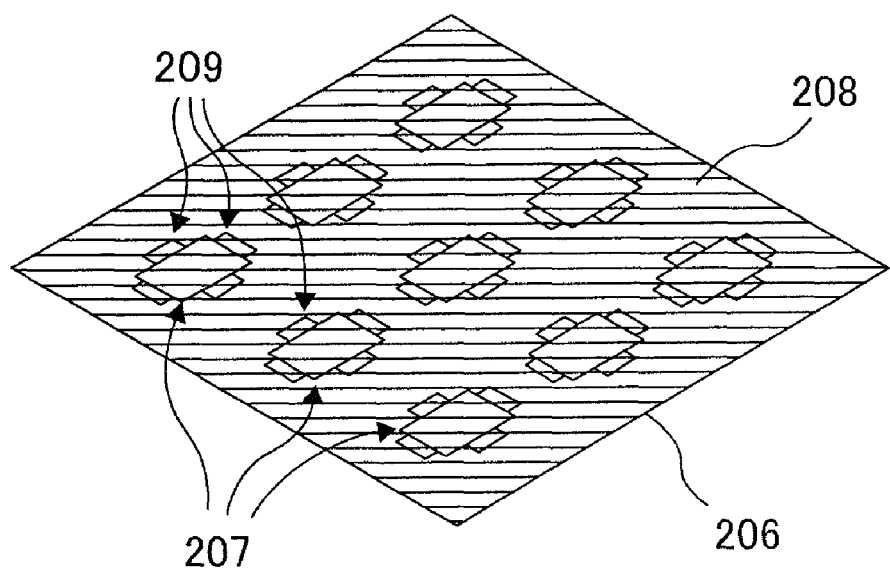
FIGS. 14A and 14B represent another related art disclosed in JP-A No. 2006-66364.
Figure 14B:
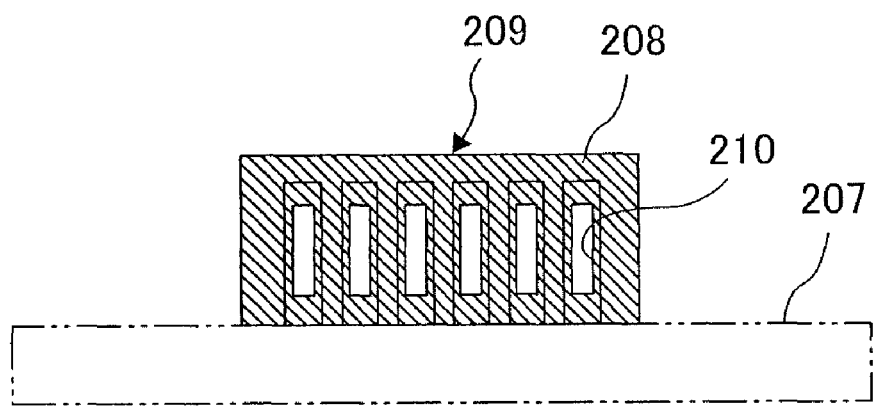

FIG. 11 shows the state where the adhesive material 38 with the same shape as that of the adhesive sheet 30 of the first embodiment is formed by applying the film. The applied film does not require the accuracy, which may be formed through the screen printing.

For example, epoxy resin or acrylic resin may be employed as the material for forming the adhesive material 38 through printing. The film thickness for the printing is in the range from 10 μm to 20 μm. The film thickness of the printing may further be reduced so long as the element substrate 10 is sufficiently adhered to the seal substrate 40.

The adhesive material 38 is printed on the mother seal substrate 400 as shown in FIG. 11, and then it is pre-baked at approximately 80° C. so as to be partially cured. The partially cured adhesive material 38 exhibits the adhesive power at the certain level. Thereafter, the mother element substrate 100 is bonded to the mother seal substrate 400 with the partially cured adhesive material 38 to form the mother panel 200. Then it is subjected to the final baking at 100° C. for two hours, or at 120° C. for 30 minutes. After the final baking, the element substrate 10 is strongly adhered to the seal substrate 40, and the adhesive material 38 exhibits the humidity resistance effect.

In the embodiment, the adhesive sheet cut portion 31 is formed to reach the left edge of the outline of the mother seal substrate 400 shown in FIG. 11. The adhesive sheet cut portion 31 reaches the edge of the mother panel 200 to avoid the problem of the influence exerted by the adhesive material around the terminal portion owing to the atmospheric pressure change after adhering the mother element substrate 100 and the mother seal substrate 400 so as to be returned to the atmosphere.

Then the mother panel 200 is separated into the respective organic EL display panels 300. The separation method is described in the first embodiment. Each breakage section of the respectively separated organic EL display panels 300 is similar to the one as described in the first or the second embodiment. That is, the cross section of the organic EL display panel 300 formed as shown in FIG. 11 becomes similar to the one as described in the first embodiment.

What is claimed is:

1. A manufacturing method of an organic EL display device comprising the steps of:
    adhering a mother element substrate on which a plurality of element substrates are formed to a mother seal substrate on which a plurality of seal substrates are formed via an adhesive sheet,
    wherein the element substrates include a first element substrate, having a first display region and a first terminal portion, and a second element substrate having a second display region and a second terminal portion, and
    wherein the first terminal portion exists between the first display region and the second display region,
    wherein the adhesive sheet formed as a single continuous sheet includes an adhesive sheet cut portion which extends to reach and define an end portion of the adhesive sheet;
    forming a mother panel by adhering, via the adhesive sheet, the mother element substrate to the mother seal substrate at a portion other than the first terminal portion formed on the element substrate corresponding to the adhesive sheet cut portion so that the first terminal portion is not covered by the adhesive sheet; and
    separating the mother panel into the organic EL display devices each having the element substrate and the seal substrate.

2. The manufacturing method of an organic EL display device according to claim 1, wherein the adhesive sheet is applied to a protective film as a roll type film.

3. The manufacturing method according to claim 1, further comprising covering a second terminal portion, adjacent the first terminal portion, with the adhesive sheet.

4. The method according to claim 1, further comprising aligning an edge of the mother seal substrate with the end portion of the adhesive sheet defined by the adhesive sheet cut portion prior to adhering the mother element substrate to the mother seal substrate so that the mother seal substrate is adhered at the portion other than the first terminal portion so that the first terminal portion is not covered by either the adhesive sheet or the mother seal substrate.

5. A manufacturing method of an organic EL display device comprising the steps of:
    adhering a mother element substrate on which a plurality of element substrates are formed via an adhesive sheet
    wherein the adhesive sheet formed as a single continuous sheet includes an adhesive sheet cut portion which extends to reach and define an end portion of the adhesive sheet, wherein the element substrates include a first element substrate, having a first display region and a first terminal portion, and a second element substrate having a second display region and a second terminal portion, and
    wherein the first terminal portion exists between the first display region and the second display region;
    forming a mother panel by adhering, via the adhesive sheet, the mother element substrate to the mother seal substrate at a portion other than the first terminal portion formed on the element substrate corresponding to the adhesive sheet cut portion while performing the adhesion under a negative pressure atmosphere so that the first terminal portion is not covered by the adhesive sheet;
    keeping the adhesive sheet cut portion of the adhesive sheet in the mother panel communicated with the atmosphere; and
    separating the mother panel into the organic EL display devices each having the element substrate and the seal substrate.

6. The manufacturing method according to claim 5, further comprising covering a second terminal portion, adjacent the first terminal portion, with the adhesive sheet.

7. The method according to claim 5, further comprising aligning an edge of the mother seal substrate with the end portion of the adhesive sheet defined by the adhesive sheet cut portion prior to adhering the mother element substrate to the mother seal substrate so that the mother seal substrate is adhered at the portion other than the first terminal portion so that the first terminal portion is not covered by either the adhesive sheet or the mother seal substrate.

8. A manufacturing method of an organic EL display device comprising the steps of:
    forming a mother panel by adhering a mother element substrate on which a plurality of element substrates are formed to a mother seal substrate on which a plurality of seal substrates are formed via an adhesive material, wherein the element substrates include a first element substrate, having a first display region and a first terminal portion, and a second element substrate having a second display region and a second terminal portion, and
    wherein the first terminal portion exists between the first display region and the second display region;
    printing an adhesive surface with the adhesive material on the mother seal substrate to have a continuous surface and forming an adhesive material cut portion of the adhesive material in the adhesive surface to extend to reach and define an end portion of the adhesive material;

disposing the adhesive surface formed on the mother seal substrate on the first and second display regions of the first and second element substrates formed on the mother element substrate to form the mother panel by adhering, via the adhesive material, the mother element substrate to the mother seal substrate to dispose the adhesive material cut portion at the first terminal portion of the first element substrate formed on the mother element substrate so that the first terminal portion is not covered by the adhesive surface of the mother seal substrate; and separating the mother panel into the organic EL display devices each having the element substrate and the seal substrate.

9. The manufacturing method of an organic EL display device according to claim 8, wherein the mother seal substrate and the mother element substrate are adhered with each other under a negative pressure atmosphere.

10. The manufacturing method according to claim 8, further comprising covering a second terminal portion, adjacent to the first terminal portion, with the adhesive surface of the mother seal substrate.

11. The method according to claim 8, further comprising aligning an edge of the mother seal substrate with the end portion defined by the adhesive material cut portion prior to disposing the adhesive surface formed on the mother seal substrate on the display region of the element substrate formed on the mother element substrate to dispose the adhesive material cut portion at the first terminal portion so that the first terminal portion is not covered by either the adhesive material or the mother seal substrate.

* * * * *